United States Patent
Kenington

(10) Patent No.: US 8,509,713 B2
(45) Date of Patent: *Aug. 13, 2013

(54) SINGLE ENVELOPE TRACKING SYSTEM FOR AN ACTIVE ANTENNA ARRAY

(75) Inventor: Peter Kenington, Chepstow (GB)

(73) Assignee: Ubidyne, Inc., Wilmington, DE (US)

( * ) Notice: Subject to any disclaimer, the term of this patent is extended or adjusted under 35 U.S.C. 154(b) by 748 days.

This patent is subject to a terminal disclaimer.

(21) Appl. No.: 12/643,572

(22) Filed: Dec. 21, 2009

(65) Prior Publication Data

US 2011/0148705 A1    Jun. 23, 2011

(51) Int. Cl.
*H01Q 11/12*    (2006.01)
*H04K 3/00*    (2006.01)

(52) U.S. Cl.
USPC .................................. 455/126; 455/127.1

(58) Field of Classification Search
USPC ............... 455/126, 127.1–127.4; 330/124 R, 330/124 D
See application file for complete search history.

(56) References Cited

U.S. PATENT DOCUMENTS

| | | | |
|---|---|---|---|
| 5,479,177 A | 12/1995 | Rudish et al. | |
| 6,445,247 B1 | 9/2002 | Walker | |
| 7,876,715 B1 | 1/2011 | Jin et al. | |
| 2003/0198300 A1 | 10/2003 | Matero et al. | |
| 2007/0210771 A1 | 9/2007 | Wilson et al. | |
| 2009/0045872 A1 | 2/2009 | Kenington | |
| 2009/0128236 A1 | 5/2009 | Wilson | |
| 2009/0130998 A1 | 5/2009 | Zolfagnari et al. | |
| 2011/0151806 A1* | 6/2011 | Kenington | 455/101 |

FOREIGN PATENT DOCUMENTS

| | | |
|---|---|---|
| GB | 2457764 | 9/2009 |
| GB | 2459324 | 10/2009 |
| WO | 2007/113724 | 10/2007 |
| WO | 2007/113726 | 10/2007 |

OTHER PUBLICATIONS

U.S. Appl. No. 12/648,000, entitled: Radio Station and Active Antenna Array, filed Dec. 28, 2008.
U.S. Appl. No. 12/562,313, entitled: Bus Bar Power Distribution for an Antenna Embedded Radio System, filed Sep. 18, 2009.
U.S. Appl. No. 12/566,735, entitled: Antenna Array, filed Sep. 25, 2009.

* cited by examiner

*Primary Examiner* — Lee Nguyen
(74) *Attorney, Agent, or Firm* — Stephen H. Eland; Dann, Dorfman, Herrell & Skillman

(57) ABSTRACT

An active antenna array comprises a plurality of transmission paths, a variable common power supply unit, and an envelope detection system. The transmission paths are adapted to carry a plurality of similar transmission path signals, wherein at least one of the plurality of transmission paths comprises an amplifier having a power input and a signal input for one of the plurality of similar transmission path signals. The variable common power supply unit is connected to the power input of the amplifier for supplying power to the amplifier. The envelope detection system is connected to an envelope input of the variable common power supply unit and adapted to provide a common envelope signal for the plurality of similar transmission path signals to the variable common power supply unit. A method for envelope tracking and computer program products for manufacture and method execution are also claimed.

21 Claims, 7 Drawing Sheets

SINGLE ENVELOPE TRACKING SYSTEM FOR AN ACTIVE ANTENNA ARRAY

CROSS REFERENCE TO OTHER APPLICATIONS

The present application is related to U.S. patent application Ser. No. 12/643,584, entitled: MULTIPLE ENVELOPE TRACKING SYSTEM FOR AN ACTIVE ANTENNA ARRAY, filed Dec. 21, 2009. The entire disclosure of the foregoing application is incorporated herein by reference.

The present application is further related to U.S. patent application Ser. No. 12/566,735 entitled "Antenna Array" filed on 25 Sep. 2009 and to U.S. patent application Ser. No. 12/562,313 entitled "Power distribution for an array of active electronic circuits in an antenna" filed on 18 Sep. 2009

FIELD OF THE INVENTION

The field of the present invention relates to an active antenna array and the processing of envelopes of signals in or by the active antenna array. The field of the present invention further relates to a method for performing envelope tracking on a plurality of amplifiers that amplify a plurality of similar transmission path signals.

BACKGROUND OF THE INVENTION

In the design of radio transmission systems, one of the concerns that have to be addressed is power efficiency. While the power efficiency was practically always important for battery-powered devices, it has also become an issue for the infrastructure of communication networks. Efforts to improve the power efficiency (among other aims) may be summarized under the keyword "Green IT". Green IT not only pertains to computers and servers but also to associated subsystems, such as monitors, printers, storage devices and networking and communications systems. Besides the need to comply with Green IT standards, network operators may expect additional advantages from employing power efficient devices and systems, such as reduced energy costs.

In the field of mobile communications systems another development can be observed. Modern communication standards sometimes require linear power amplification in contrast to, for example, frequency-modulation (FM) based systems for which highly non-linear transmitters and receivers were sufficient. Linear power amplification compromises overall system energy efficiency because radio frequency (RF) power amplifiers (PAs) are less efficient when they are operated at a power level that is below the power amplifier's maximum power (backed-off operating mode). It has been estimated that the power amplifier and its associated components consume up to 50% of the overall power in a cellular base station.

Modern mobile communications standards such as UMTS, WiMAX and Long Term Evolution (LTE) are intended to support a variety of different channel coding and modulation techniques (CDMA, OFDM, etc.), broader channel bandwidths and high peak-to-average power ratio (PAPR) modulation schemes. Moreover, there is an increasing demand for base stations supporting a wider range of frequency bands. Such base stations are more flexible and may be reconfigured if new frequency slots become available or a frequency slot gets assigned to a new communications standard, such as UMTS.

These developments place a high demand on the power amplifiers in the base transceiver station, in particular, with respect to linearity, bandwidth and power efficiency. Linearity and power efficiency tend to contradict each other. In the past, several solutions were proposed to overcome this dilemma.

One of these solutions is envelope tracking. Envelope tracking is being widely researched and is undergoing development in a number of companies. Envelope tracking means that the supply voltage of the radio frequency amplifier is adapted to the instantaneously needed output power. For low output powers the supply voltage is reduced and for high output powers it is increased. The power amplifier may be driven near its (instantaneous) maximum output power where it has maximum efficiency if the supply voltage follows the instantaneous output power in a continuous manner. It is also possible to adjust the supply voltage in a step-wise manner which usually still results in good power efficiency for the power amplifier.

The LTE standard has a relatively high peak-to-average ratio. Envelope tracking usually offers good power efficiency for signals having a high peak-to-average ratios. Therefore, envelope tracking appears to offer a compelling efficiency case for LTE signals and similar standards.

U.S. Patent Application Publication No. US 2009/0045872 A1 discloses an integrated transceiver with envelope tracking. A power supply is operable for varying a level of power supplied to an amplifying circuit (by varying the voltage of the supply) in response to the variation of an input signal envelope directed to the power supply. The processing circuit is operable for digitally detecting the input signal envelope to provide variation of the power supply level. The processing circuit includes an envelope pre-distortion circuit operable for receiving and pre-distorting the input signal envelope before it is directed to the power supply. The entire disclosure of U.S. Patent Application Publication No. US 2009/0045872 A1 is incorporated herein by reference.

Envelope tracking is also discussed in UK Patent Application GB 2457764 A, in US Patent Application Publication Nos. US 2009/0128236 A1 and US 2007/0210771 A1, and in the International Application published under the International Publication No. WO 2007/113726 A1. The entire disclosures of the foregoing applications are incorporated herein by reference. The mentioned documents disclose transmitters or transceivers having a single transmission path. The envelope tracking structure is exclusively dedicated to the single transmission path.

SUMMARY OF THE INVENTION

The active antenna array of the current disclosure comprises a plurality of transmission paths, a variable common power supply and an envelope detection system. The transmission paths carry a plurality of similar transmission path signals. At least one of the plurality of transmission paths comprises an amplifier having a power input and a signal input for one of the plurality of similar transmission path signals. The variable common power supply unit is connected to the power input of the amplifier for supplying power to the amplifier. The envelope detection system is connected to an envelope input of the variable common power supply unit and adapted to provide a common envelope signal for the plurality of similar transmission path signals to the variable common power supply unit.

The similar transmission path signals are usually created from a common transmission signal. The transmission path signals have near-identical envelopes: The envelopes are basically the same, with the differences being in their absolute values of amplitude and phase (which could be quite large). The differences in phase between the different antenna path signals may be quasi-static. When applied to an array of antenna elements having a certain geometry and spacing, the differences in phase and/or amplitude lead to a certain directivity of the array of antenna elements. The directivity can be used to increase a radiated power density in a certain spatial direction and reduce the radiated power density in other directions that are of low interest for the current purpose of the array of antenna elements.

An output of the variable common power supply unit is connected to the power input of the amplifier, possibly by means of one or more intermediate elements. In a typical radio transmission array there are usually several similar amplifiers that are part of the various transmission paths. In this case the variable common power supply is connected to several of the amplifiers, for example by means of a network or distribution structure.

The envelope detection system is connected via an output of the envelope detection system to the envelope input of the variable common power supply unit. Thus, the variable common power supply unit and the envelope detection system serve several of the plurality of transmission paths and the amplifiers thereof. The common envelope signal provided by the envelope detection system is representative of the envelope of one of the transmission path signals, or of even all of the transmission path signals. As noted above, the shape of the envelope is near-identical for all paths. In this manner, the common envelope signal is representative of the individual envelope signals of the various transmission path signals.

Compared to the amplifiers in the plurality of transmission paths, the variable common power supply unit processes relatively slow signals, only. At low frequency it is usually easier to take into account power efficiency issues of the variable common power supply unit.

The variable common power supply unit can be designed in a power-efficient manner. Furthermore, the fact that a single variable common power supply unit serves several transmission paths justifies a higher effort to achieve good power efficiency, as additional effort is required only once per variable common power supply unit, as opposed to once per transmission path.

The active antenna array may further comprise a digital-to-analogue converter. An input of the digital-to-analogue converter is connected to the envelope detection system and an output of the digital-to-analogue converter is connected to the variable common power supply unit. Thus, the envelope detection system provides a digital control signal which is converted by the digital-to-analogue converter and then passed on to the variable common power supply unit, for example. Besides other reasons, this may be of interest if there is a digital data communication network or bus available between a location of the envelope detection system and a location of the variable common power supply unit. The control signal could then be sent over the digital data communication network or bus (or a similar data communication structure) so that no additional (analogue) lines or connections would be needed between the envelope detection system and the variable common power supply unit.

The envelope detection system may be adapted to receive at least one of the plurality of similar transmission path signals and to determine the common envelope signal on the basis of the at least one of the plurality of similar transmission path signals. A similarity between the similar transmission path signals can be exploited so that the envelope detection system needs to be connected to only one of the transmission paths. Furthermore, the envelope detection system does not need to combine several of the plurality of similar transmission path signals. The envelope detection system could also utilise an envelope of a common input signal for the active antenna array prior to the common input signal being split into the plurality of transmission paths. The common input signal could be supplied on a CPRI, OBSAI or P-OBRI link or similar. Thus, the amount of data processing and/or hardware of the envelope detection system is reduced. For the purposes of envelope tracking it is usually sufficient to detect a rough shape of the envelope. Therefore, even if some small differences between the envelopes of two transmission path signals would exist, the negative effect of using a "wrong" envelope signal can be assumed to be negligible in most cases.

One of the variable common power supply unit and the envelope detection system may comprise a pre-distorter adapted to pre-distort the common envelope signal to provide a margin between an envelope of the at least one of the plurality of similar transmission path signals and the common envelope signal and to overcome any non-linear behaviour of the envelope detection system itself or of the variable common power supply's input/output transfer characteristic or of the power supply tracking characteristics of the RF power amplifier's power semiconductor device(s). A sufficient headroom in the power supply voltage to the amplifier allows the amplifier to amplify its input signal without going too far into compression (or clipping). At lower envelope levels, for example, the pre-distorter may well provide ample headroom, since close tracking at these low power levels yields little in the way of additional efficiency benefit. The pre-distorter could have a linear characteristic, progressive characteristic, or a regressive characteristic acting on the amplitude of the common envelope signal (or a combination of all three). In order to provide ample headroom at lower envelope levels, as mentioned above, the characteristic may have an offset for a zero or low envelope signal.

The variable common power supply unit may comprise an envelope power supply, a comparator and a selector switch. An output of the envelope power supply is connected to the power input of the amplifiers. The comparator is adapted to compare the common envelope signal with a threshold to provide a comparator output signal. The selector switch is controlled by the comparator output signal and adapted to selectively connect an input of the envelope power supply with the common envelope signal if the envelope signal is greater than the threshold. The selector switch connects the input of the envelope power supply with a constant signal if the common envelope signal is smaller than the threshold. The function of the comparator is to remove the tracking behaviour entirely when the signal envelope drops to a low level. At low levels of the common envelope signal the efficiency benefits of providing tracking at low power levels are neglectable and are far outweighed by the increased distortion issues which tracking can add at these power levels. The envelope power supply may be constructed as a high-efficiency (switching or switched mode) power supply or amplifier.

The variable common power supply unit may comprise a plurality of fixed power level supplies and a plurality of switches connected to the plurality of fixed power level supplies. The at least one of the plurality of fixed power level supplies may provide a different power level than another one of the plurality of fixed power level supplies. The plurality of switches may be adapted to connect a temporarily selectable one of the plurality of fixed power level supplies with the power input of the plurality of amplifiers. The implementation of the variable common power supply as just described does not provide a continually variable power supply level, but only a limited number of discrete power levels. On the other hand, the implementation of such a variable common power supply unit with a plurality of fixed power level supplies is simple and relatively power efficient. In particular, the switches can be operated in a very power efficient manner because the switches are usually either completely closed or completely open. In many cases, particularly at lower power levels, the simplicity, low power consumption and improved power supply unit efficiency of this approach more than makes up for its sub-optimal tracking performance.

The fact that a temporarily selected one of the plurality of fixed power level supplies is connected with the power input of the plurality of amplifiers does not exclude a concurrent connection of several fixed power level supplies. In other words, two or more of the plurality of fixed power level supplies could be connected to the power input of the plurality of amplifiers.

The variable common power supply as just described, i.e. comprising a plurality of fixed power level supplies, may further comprise a plurality of comparators adapted to compare the common envelope signal with a plurality of power thresholds and to control the plurality of switches in order to connect the temporarily selected one of the plurality of fixed power level supplies with the power inputs of the plurality of amplifiers, as a function of which power thresholds are greater than the common envelope signal. The power thresholds control the operation of the variable common power supply unit by selecting which one (or ones) of the plurality of fixed power level supplies should be connected to the power inputs of the plurality of amplifiers.

Each of the plurality of fixed power level supplies may provide a different fixed voltage. In this manner, the voltage supplied to the power input of the plurality of amplifiers is step-wise adjusted as a function of the common envelope signal. The supply voltage of an amplifier has a direct influence on the power of the amplified signal at the output of the amplifier.

The envelope detection system may be implemented as a digital circuit. In modern radio transmission systems at least a part of the signal processing is usually performed digitally. A digital implementation of the envelope detection system may use a digital version of one or several of similar transmission path signals to determine the common envelope signal using digital signal processing. To this end, resources of a digital processing infrastructure which is present anyway may be used, which means that no or only little additional hardware is necessary for the envelope detection system. Digital processing also offers some degree of flexibility for the implementation of the envelope detection system. Examples of digital circuits that may be used are field programmable gate arrays (FPGA), microprocessors or DSPs.

The envelope detection system may further comprise at least one of a digital pre-distorter acting on the common envelope signal and a comparator adapted to compare the common envelope signal with a threshold. Digital implementation of a pre-distorter and/or a comparator is relatively easy and more accurate, compared to an equivalent analogue implementation.

The envelope detection system may be implemented in software for execution by a digital signal processor. Digital signal processors are available for a large range of computing powers, resolutions, dynamic ranges and other properties. It may be interesting from an economic point of view to use a digital signal processor that may already be present in a radio transmission system for the purposes of the envelope detection system.

The software may further implement at least one of a digital pre-distortion of a common envelope signal and a comparator of the common envelope signal with a threshold.

It may be desirable to expand the principles of the teachings disclosed herein to an active antenna array having at least two different kinds of transmission paths, in particular with respect to the power ratings in the two different kinds of transmission paths. This concern and/or possibly other concerns are addressed by the active antenna array further comprising at least one additional variable common power supply unit. The at least one additional variable common power supply unit supplies at least one additional group of amplifiers, while the variable common power supply unit supplies a first group of amplifiers. The amplifiers of the first group of amplifiers have a first power rating and the amplifiers of the at least one additional group have at least one additional power rating different to the first power rating. Some active antenna arrays provide different power ratings for the transmission paths, as a function of the geometric position of the transmission path within the active antenna array (the geometric position of an antenna element within the arrangement of the antenna elements, the antenna element being connected to the transmission path, to be more precise). Nevertheless, the signals amplified by the amplifiers in the first group of amplifiers and the signals amplified by the amplifiers in the at least one additional group of amplifiers are substantially similar. With the proposed structure the envelope detection system supplies both the variable common power supply unit and the additional variable common power supply unit with the common envelope signal. The variable common power supply unit and the at least one additional variable common power supply unit then use the common envelope signal to produce power suitable for the amplifiers in the first group of amplifiers and the amplifiers in the at least one additional group of amplifiers. In contrast, a single variable common power supply unit would have to make a compromise between the amplifiers having the first power rating and the amplifiers having the at least one additional power rating.

Each of the plurality of transmission paths may comprise an antenna element and the first group of amplifiers and the at least one additional group of amplifiers may provide a profiled power distribution of the active antenna array over the antenna elements of the plurality of transmission paths. For many applications of active antenna arrays a profiled power distribution may be implemented. The profiled power distribution is based on the insight that for achieving a certain directivity of an array of antenna elements the amplitude of the signals radiated by the various antenna elements may be different from one antenna element to the next. In particular, the profiled power distribution usually provides for a higher power at the centre of the array of antenna elements and for a lower power towards the edges of the array of antenna elements. If the profiled power distribution is known at the time the active antenna array is designed, the amplifiers of the various transmission paths may be chosen as a function of the geometrical position of the transmission path within the array. The amplifiers are then usually operated close to their specification, resulting in a good power efficiency for the individual amplifier. The concept of profiled power distribution has been described in U.S. patent application Ser. No. 12/566,735, entitled "Antenna array", in the name of Kenington, assigned to Ubidyne, Inc., filed on 25 Sep. 2009. The entire disclosure of the foregoing application is incorporated herein by reference. The common envelope signal could also be adjusted to the individual power rating of the power amplifier in a given transmission path as a function of other profiled power distribution, for example by using an attenuator or by adapting the control signal mentioned above in the context of the fixed power level supplies to the power rating of the amplifier in question, or according to the profiled power distribution scheme.

The amplifiers of the plurality of transmission paths may be Doherty amplifiers. Doherty amplifiers are actually an alternative solution to envelope tracking since they also attempt to reconcile power efficiency and linearity. However, it is also possible to combine the two concepts in order to further improve the linearity and/or the power efficiency.

Each of the plurality of transmission paths may comprise an up-convertor for up-converting a corresponding one of the plurality of transmission path signals to a radio frequency range, and the amplifiers of the plurality of transmission paths may be adapted to amplify a radio frequency signal. The up-converting may be achieved by means of various concepts, some of which will be described in the detailed description of the embodiments below. The teachings disclosed herein may be particularly valuable for radio frequency amplifiers, since these consume a significant amount of power. Therefore, any improvement in power efficiency of the radio frequency amplifiers could result in interesting overall savings for the operator of a base station and a mobile communications network.

The active antenna array may further comprise a feedback path between an output of at least one of the plurality of transmission paths and the envelope detection system. The envelope detection system may be adapted to perform an analysis of a feedback signal transmitted via the feedback path and to adjust settings used for generating the common envelope signal as a function of the analysis of the feedback signal. The feedback signal could be analysed for indicators of non-linearities in the transmission paths. Often, a feedback path is present for other reasons already, such as calibration or digital pre-distortion of the transmission path signals. In this case, the existing feedback path may be used for the purposes of envelope tracking, too. It may be also envisaged to use the feedback path for testing the functionality of the envelope tracking during a power-on self test of the active antenna array, for example. A distinctive transmission path signal and/or a distinctive common envelope signal could be provided to the transmission path and the variable common power supply unit. The resulting feedback signal at the output of at least one of the plurality of transmission paths could then be compared with an expected shape of the feedback signal.

The present disclosure further provides a computer program product embodied on a computer-readable medium and the computer-readable medium comprising executable instructions for the manufacture of an interference cancellation device as described herein.

The present disclosure further provides a method for performing envelope tracking on a plurality of amplifiers that amplify a plurality of similar transmission path signals. The method comprises detecting an envelope of at least one of the plurality of similar transmission path signals; generating a common envelope signal based on the detected envelope of at least one of the plurality of similar transmission path signals or of the system's input signals; controlling a variable common power supply unit with the common envelope signal; and distributing a supplying power provided by the variable common power supply unit to the plurality of amplifiers.

The method may further comprise method steps that correspond to some optional technical features of the active antenna array, such as
digital-to-analogue-converting the envelope signal,
receiving, at the envelope detection system, at least one of the plurality of similar transmission path signals and determining the common envelope signal on the basis of the at least one of the plurality of similar transmission path signals,
pre-distorting the common envelope signal to provide a margin between an envelope of the at least one of the plurality of similar transmission path signals and the common envelope signal,
comparing the common envelope signal with a threshold to provide a comparator output signal and controlling a selector switch in order to selectively connect an input of the envelope power supply with the common envelope signal if the envelope signal is greater than the threshold and with a constant signal if the common envelope signal is smaller than the threshold,
temporarily selecting one of a plurality of fixed power level supplies for connection with the power inputs of the plurality of amplifiers,
comparing the common envelope signal with a plurality of power thresholds and controlling the plurality of switches in order to connect the temporarily selected one of the plurality of fixed power level supplies with the power inputs of the plurality of amplifiers, as a function of which power thresholds are greater than the common envelope signal,
digitally pre-distorting the common envelope signal and digitally comparing the common envelope signal with a threshold,
distributing the common envelope signal to the variable common power supply unit and at least one additional variable common power supply unit where the variable common power supply unit supplies amplifiers having a first power rating and the at least one additional variable common power supply unit supplies amplifiers having at least one additional power rating different to the first power rating,
adapting the common envelope signal or power supplied by the variable common power supply unit according to a profiled power distribution,
amplifying the transmission path signals by means of Doherty amplifiers or conventional class-A, class-AB or class-B amplifiers,
upconverting the similar transmission path signals to a radio frequency range,
feeding a feedback signal back from an output of at least one of the plurality of transmission paths to the envelope detection system and performing an analysis of the feedback signal to adjust settings used for generating the common envelope signal as a function of the analysis of the feedback signal.

The present disclosure also provides a computer program product comprising instructions that enable a processer to carry out the method as described herein.

As far as technical meaningful, the technical features disclosed herein may be combined in any manner. At least parts of the active antenna array and the method for performing envelope tracking may be implemented in software, in hardware, or as a combination of both software and hardware.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalence. It will be understood that features of one aspect can be combined with a feature of a different aspect or aspects.

Figure 1:
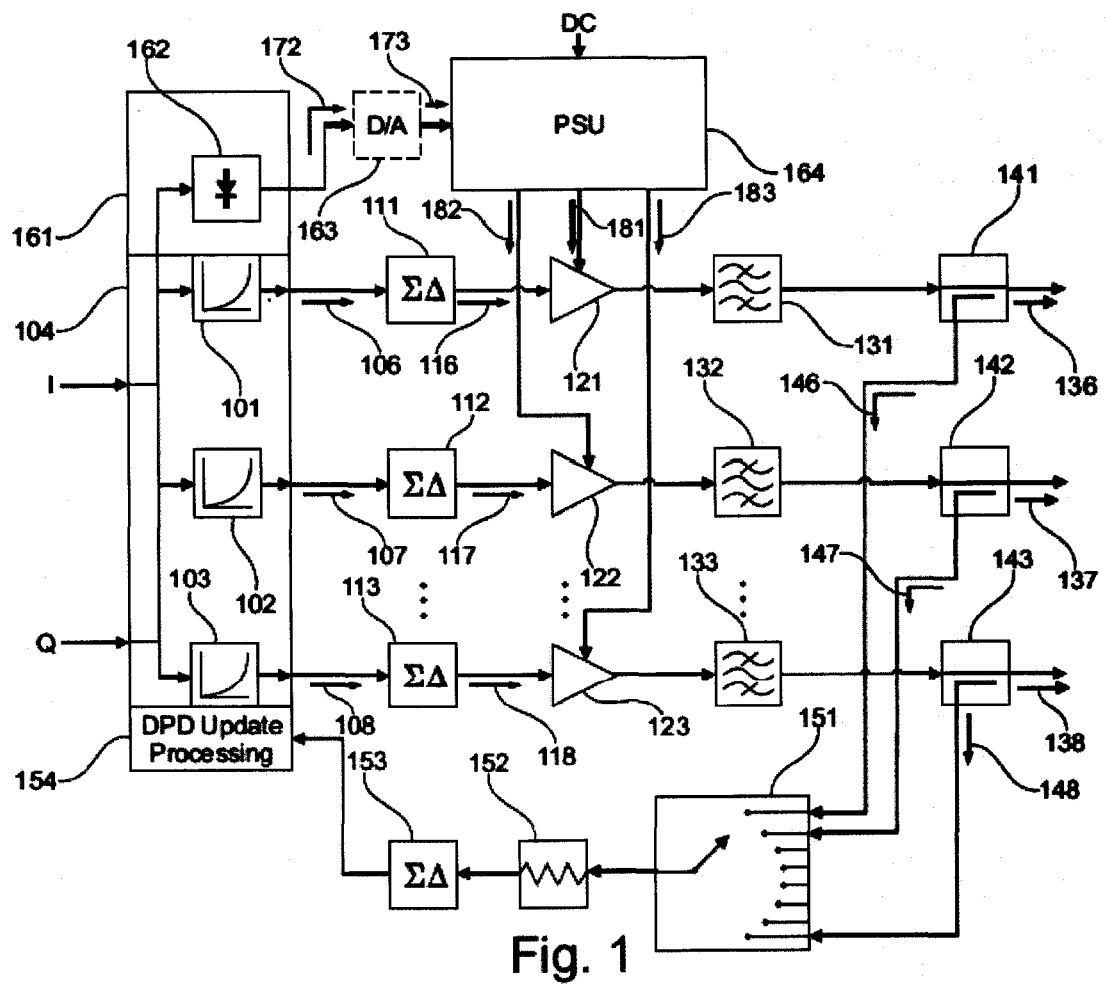
FIG. 1 shows an active antenna array with common envelope tracking according to a first possible configuration.

FIG. 1 shows a schematic block diagram of an active antenna array according to a first possible configuration. The active antenna array comprises a plurality of transmission paths, three of which are illustrated in FIG. 1.

A signal to be transmitted reaches the active antenna array from the left. In FIG. 1 the signal to be transmitted is illustrated as comprising an in-phase component I and a quadrature component Q. The signal to be transmitted may be present at a base band frequency range, an intermediate frequency (IF) range, or at a radio frequency (RF) range. In the configuration shown in FIG. 1 the signal to be transmitted is represented as a digital signal, although this is not a requirement of the teachings disclosed herein. The signal to be transmitted is fed to a digital signal processor (DSP) 104. The DSP 104 distributes the signal to be transmitted to a plurality of transmission paths as well as to an envelope detection system 161, the function of which will be described below. Each of the three illustrated transmission paths (there could be more transmission paths which would be substantially identical in their structure) comprises a pre-distorter 101, 102, and 103 which is implemented as a part of the digital signal processor 104. For example, the pre-distorters 101, 102, 103 could employ both hardware resources and software resources of the DSP 104 for calculating a pre-distorted transmission path signal 106, 107, 108 for each of the illustrated transmission paths. It may be possible under certain circumstances to move the pre-distorters 101, 102, 103 to a place upstream of the point where the signal to be transmitted is distributed to the transmission paths. In that case, only one pre-distorter would be needed, which is imaginable if a non-linear behaviour of the various transmission paths can be assumed to be similar.

The pre-distorted transmission path signals 106, 107, 108 are forwarded to digital-to-analogue-converters 111, 112, 113, on a per-transmission path basis. In FIG. 1 the digital-to-analogue-converters 111, 112, 113 are represented as delta-sigma-modulators. Besides the digital-to-analogue-conversion function the delta-sigma-modulators 111, 112, 113 are also used for frequency converting the pre-distorted transmission path signals 106, 107, 108 to another frequency range, in the case of FIG. 1 a radio frequency range. The digital-to-analogue-converters 111, 112, 113 produce upconverted transmission path signals 116, 117, 118, respectively.

The upconverted transmission path signals 116, 117, 118 are fed to the signal inputs of amplifiers 121, 122, 123 which are usually RF power amplifiers. The amplified transmission path signals are then filtered by bandpass filters 131, 132, 133 (which would typically be part of a duplex filter, the receive part of which is not shown in FIG. 1) to produce filtered transmission path signals 136, 137, 138. The filtered transmission path signals 136, 137, 138 are then sent, for example, to an array of antenna elements (not shown), indicated by the arrows on the right side of FIG. 1.

In the configuration shown in FIG. 1 the transmission paths further comprise taps 141, 142, 143 adapted to tap a portion of filtered transmission path signals 136, 137, 138 for feedback purposes. The taps 136, 137, 138 detect feedback signals 146, 147, 148 which are fed to a selection switch 151. The selection switch 151 connects one of the feedback signals 146, 147, 148 with an output of the selection switch 151. An attenuator 152 is connected to the output of the selection switch 151. An analogue-to-digital converter 153 (illustrated as a delta-sigma-modulator in FIG. 1) performs an analogue-to-digital conversion so that an output signal of the analogue-to-digital converter 153, i.e. a digitised feedback signal, may be fed to the DSP 104. The digitised signal is processed by a DPD update processing block 154 that is a part of DSP 104. The DPD update processing block 154 controls pre-distortion parameters used by the pre-distorters 101, 102, 103. To this end, DPD update processing 154 may compare the signal to be transmitted I, Q with the digitised feedback signal, which is representative of one of the filter transmission path signals 136, 137, 138, as a function of the position of the selection switch 151. Digital pre-distortion (DPD) has been discussed, for example, in U.S. Provisional Patent Application No. 61/141,883 in the name of Kenington and Neumann, filed 31 Dec. 2008 and entitled "A radio station employing a combiner and a common feedback signal in order to linearise a transfer characteristic of at least one transmit path of the radio station". The disclosure of the foregoing application is incorporated herein by reference.

The amplifiers 121, 122, 123 operate under the principle of envelope tracking. To this end, the signal to be transmitted I, Q is fed to the envelope detection system 161 which has already been mentioned above. The envelope detection system 161 comprises an envelope detector 162. Note that the diode symbol in the block designated by reference sign 162 does not mean that the envelope detector 162 is necessarily implemented using a diode. Rather, the envelope detector 162 could also employ digital algorithms to detect the envelope of the signal to be transmitted I, Q. Nevertheless, it is not excluded that an analogue envelope detector external to the DSP 104 may be used.

The envelope detection system 161 produces a common envelope signal 172 which may be fed to an optional digital-to-analogue converter 163. In case the digital-to-analogue converter is provided, an analogue common envelope signal 173 is fed to a power supply unit (PSU) 164. In case no digital-to-analogue converter 163 is provided, the common envelope signal 172, which is still digital, is forwarded to the PSU 164. The PSU 164 is connected to a DC power source. In the alternative, the PSU 164 could be connected to an AC power source and generate any required DC power itself. The PSU 164 is connected, at its output(s) to power inputs of the amplifiers 121, 122, 123. In this manner, the common envelope signal 172 (or the analogue common envelope signal 173) is used by the PSU 164 to determine power levels 181, 182, 183 that are currently required by the amplifiers 121, 122, 123.

The basic concept of the configuration shown in FIG. 1 is that the single envelope tracking PSU 164 is used to supply all of the RF power amplifiers 121, 122, 123 in the active antenna array with variable power, thereby potentially saving costs in comparison to a solution in which each RF power amplifier 121, 122, 123 would have its own tracking power supply. The configuration shown in FIG. 1 is possible because of the operating principle of active antenna arrays, in particular a certain similarity between the transmission path signals in the various transmission paths. For many applications of active antenna arrays it is often sufficient to modify a phase information among the various transmission paths in order to achieve a so-called beam steering capability. In these applications the amplitude information remains unchanged and is therefore identical for all transmission paths and the amplifiers within the transmission paths. Even if the beam steering method would also modify the amplitude information for the various transmission paths the teachings disclosed herein could still be implemented, for example by providing additional components acting on the supply powers 181, 182, 183. Typically, the amount and shape of a so called "amplitude tapering" is known or derivable from the beam steering method so that the corresponding compensation could be provided for with respect to the supply powers 181, 182, 183. The amplitude tapering does not alter the signal envelope being transmitted, only the absolute power level at which this envelope is being transmitted.

Note that in the event that the ideas contained in the applicant's co-pending U.S. patent application Ser. No. 12/566,735, entitled "Antenna array" are implemented, a version of the teachings disclosed herein could still be used since there is only a limited number of power amplifier ratings proposed in U.S. Ser. No. 12/566,735, with each rating being shared by a number of amplifiers. Each of these families of amplifiers could therefore share a single tracking power supply, reducing the number of supplies required to, for example, three, in place of e.g. 16 which would otherwise be required.

Figure 2:
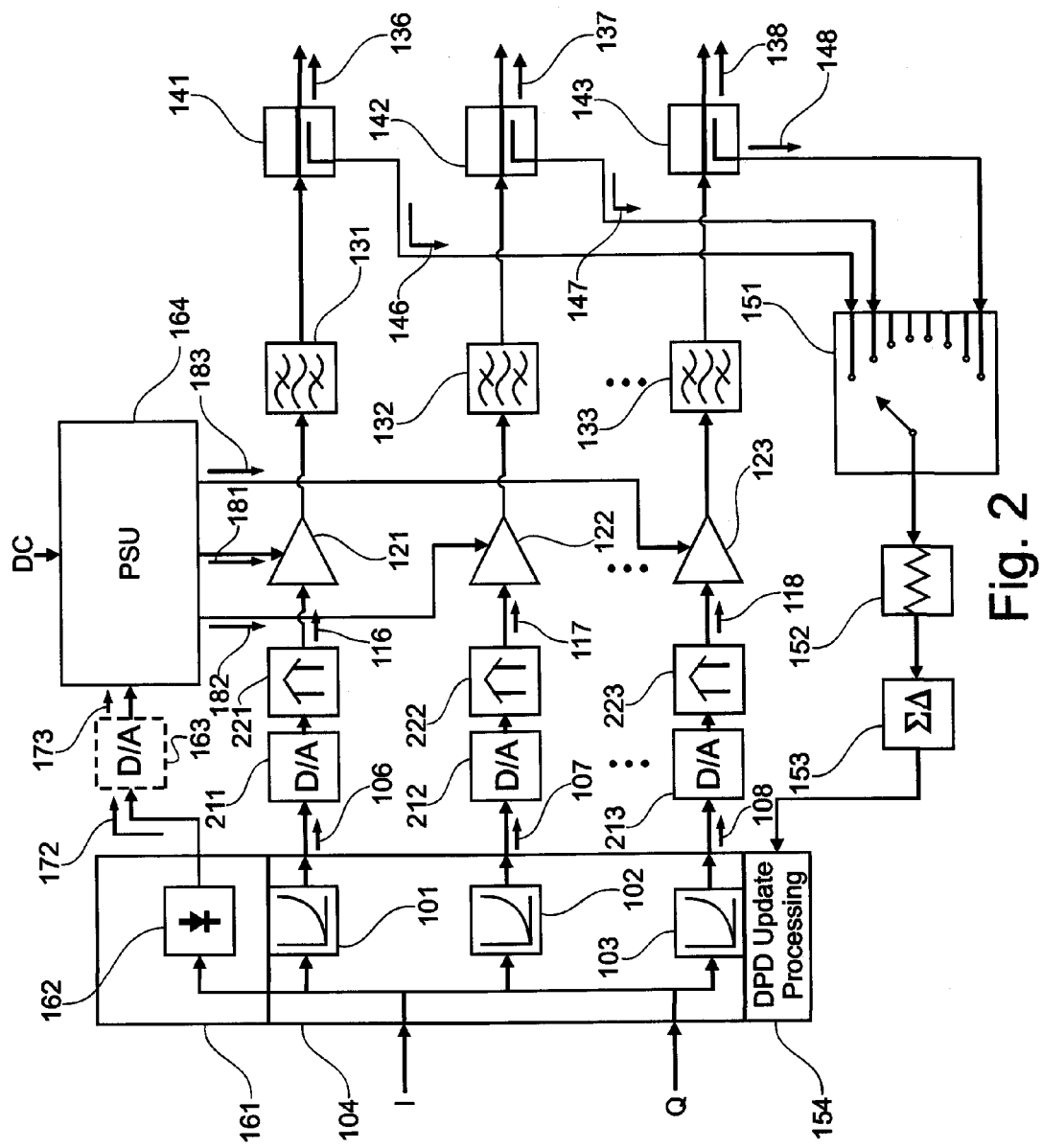
FIG. 2 shows an active antenna array with common envelope tracking according to a second possible configuration.

FIG. 2 shows a variant of FIG. 1 in which a conventional upconversion architecture is utilised in place of the delta-sigma digital-to-analogue converters 111, 112, 113. The first transmission path comprises a digital-to-analogue converter 211 and an upconverter 221. Downstream of the upconverter 221 an optional filter (not shown) may be employed for filtering the upconverted transmission path signal prior to feeding it to the signal input of the amplifier 121.

In the further transmission paths the delta-sigma-modulators have also been replaced by digital-to-analogue converters and upconverters. In particular, the second transmission path comprises a digital-to-analogue converter 212 and an upconverter 222. An optional filter (not shown) may be used to filter the upconverted transmission path signal. The n'th transmission path comprises a digital-to-analogue-converter 213 and an upconverter 223. As before, optional filtering of the upconverted transmission path signal may be provided for.

Figure 3:
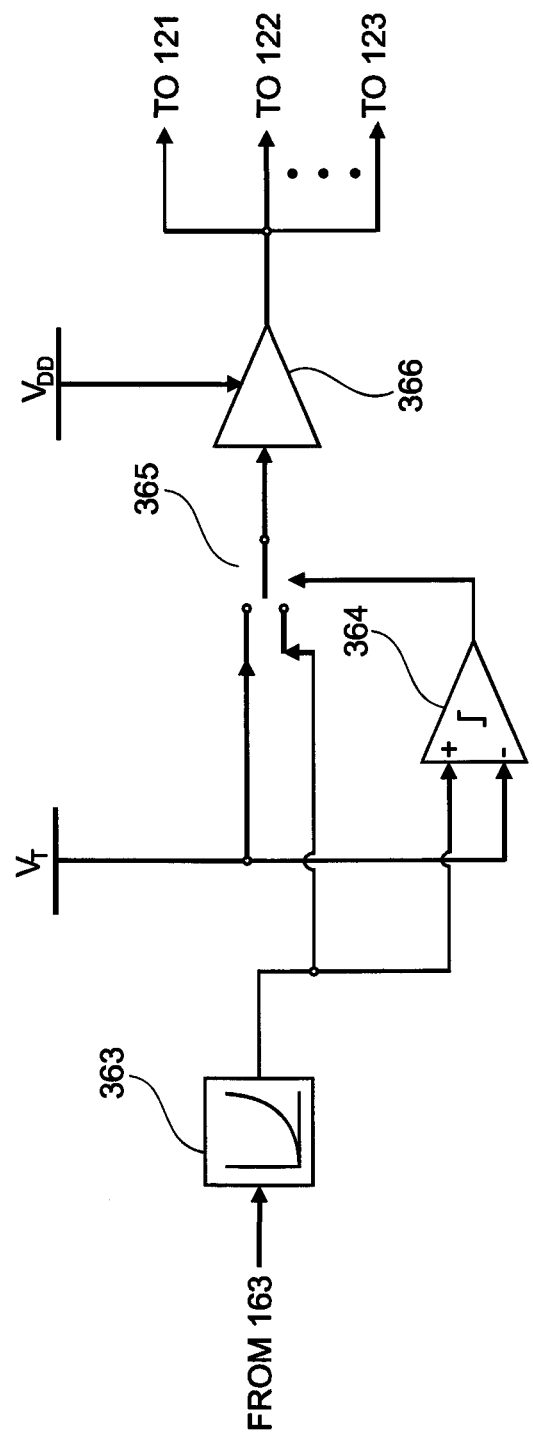
FIG. 3 shows an example of the internal architecture of the variable common power supply unit.

FIG. 3 shows an example of the internal architecture which could be used for the variable common power supply unit. The analogue common envelope signal 173 emanates from the analogue envelope detection system 161 and the digital-to-analogue-converter 163. The analogue common envelope signal 173 is pre-distorted by analogue pre-distorter 363 and fed to a comparator 364. The function of the analogue pre-distorter 363 is to modify the analogue common envelope signal 173 to ensure that it always provides sufficient "headroom" in the power supply voltage to the amplifier(s), to allow the amplifier(s) to amplify its/their input signal(s) without going too far into compression (or clipping). At lower envelope levels, for example, it can provide ample headroom, since close tracking at these low power levels yields little in the way of additional efficiency benefit. The function of the comparator 364 is to remove the tracking behaviour entirely, when the (pre-distorted) analogue common envelope signal drops to a low level—the efficiency benefits of providing tracking at low power levels are negligible and are far outweighed by the increased distortion issues which tracking can add at these power levels.

An output signal of the comparator 364 controls an analogue switch 365 which connects a threshold voltage $V_T$ with an input of an envelope power supply 366 if the analogue common envelope signal is lower than the threshold voltage $V_T$. In the opposite case the analogue switch 365 connects the input of the envelope power supply 366 with an output of the pre-distorter 363 so that the pre-distorted analogue common envelope signal 173 is applied to the input of the envelope power supply 366.

The envelope power supply 366 delivers a power level at an output of the envelope power supply 366 that is a function of the signal at its input. The envelope power supply 366 is connected to a power source $V_{DD}$. The power source $V_{DD}$ may be a DC voltage source.

The power provided by the envelope power supply 366 at its output is distributed to the amplifiers 121, 122, 123 in the plurality of transmission paths.

Figure 4:
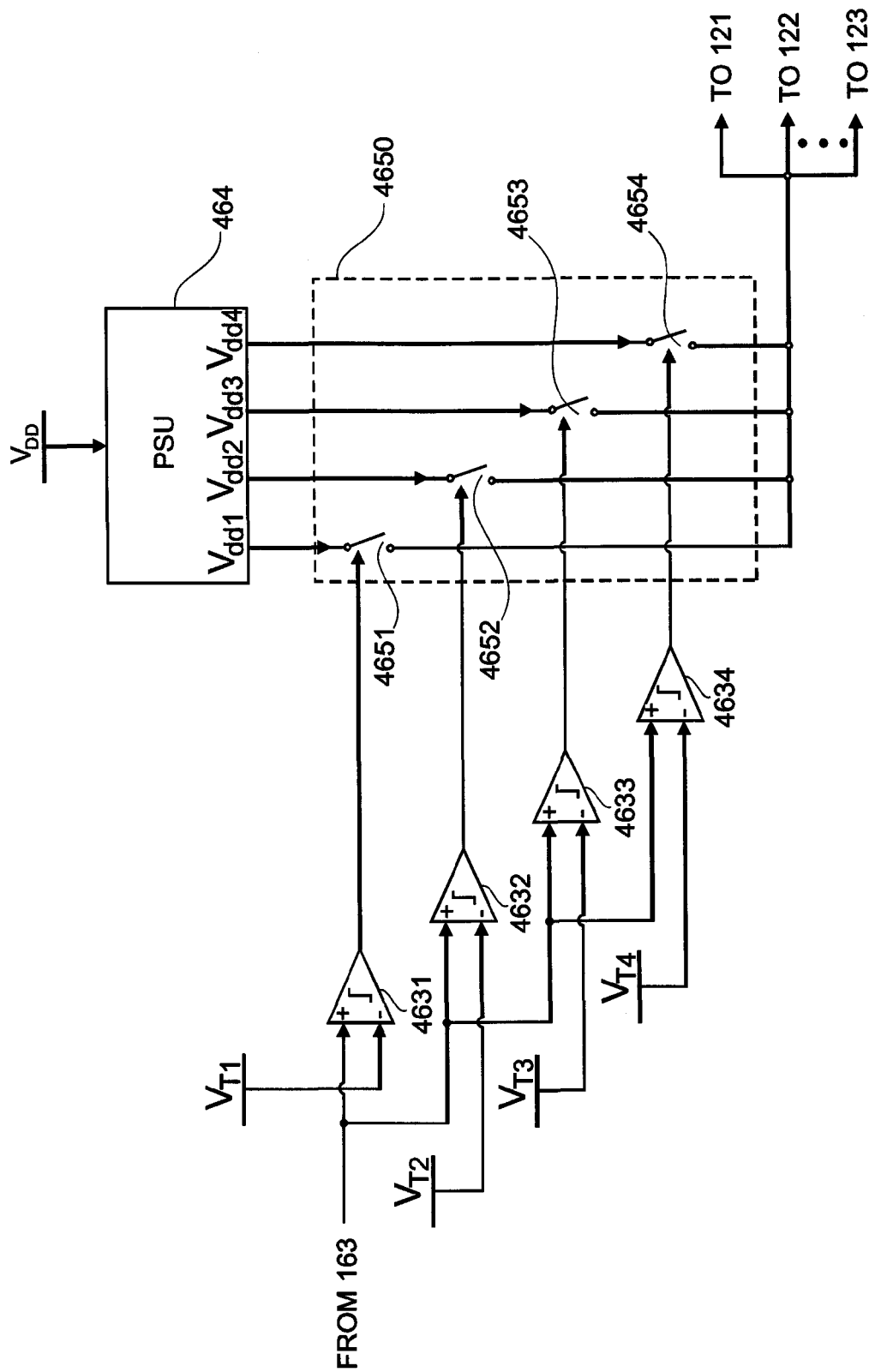
FIG. 4 shows another example of the internal architecture of the variable common power supply unit.

FIG. 4 shows an alternative option for the internal construction of the variable common power supply unit 164 shown in FIG. 1. In this case, a number of discrete supply voltages are provided and switched, either individually or in combination, to provide the required supply voltage to the amplifiers 121, 122, 123.

The analogue common envelope signal 173 (pre-distorted or not) is distributed to a number of comparators 4631, 4632, 4633, and 4634. The uppermost comparator 4631 is also connected, via another one of its input terminals, to a first threshold voltage $V_{T1}$. An output of the comparator 4631 is connected to a control input of a switch 4651. FIG. 4 shows three further comparators 4632, 4633, 4634, as well as three further switches 4652, 4653, 4654. Each of the three further comparators compares the analogue common envelope signal 173 with a different threshold voltage $V_{T2}$, $V_{T3}$ and $V_{T4}$. The outputs of the comparators 4632, 4633 and 4634 are connected to control inputs of the switches 4652, 4653, 4654, so that comparison results generated by the comparators 4632, 4633, 4634 control the action of the switches 4652, 4653 and 4654.

The switches 4651, 4652, 4653 and 4654 are part of a switch matrix 4650. Each of the switches 4651 to 4654 comprises the control input already mentioned above. Furthermore, each switch comprises two power terminals. The switches 4651 to 4654 are connected together at one of the two power terminals, respectively. The other of the two power terminals of each switch is connected to a multi-output (fixed) PSU 464. For example, switch 4651 is connected to a power level $V_{dd1}$ of the multi-output (fixed) PSU 464. Likewise, the other switches 4652 to 4654 are connected to power levels $V_{dd2}$, $V_{dd3}$ and $V_{dd4}$, respectively. The multi-output (fixed) PSU 464 is in turn connected to power source $V_{DD}$.

The terminals of the switches 4651 to 4654 that are connected together (or "bridged") are also connected to the power inputs of the amplifiers 121, 122, 123.

The solution of FIG. 4 may be a sub-optimal solution, relative to that of FIG. 3, however, it no longer requires a high-power variable voltage supply and its implementation is therefore simple. In many cases, particularly at lower power levels, the simplicity, low power consumption and improved PSU efficiency of the approach shown in FIG. 4 more than make up for its sub-optimal tracking performance.

Two or more of the switches 4651 to 4654 may be closed at the same time. In this case the power levels of different outputs $V_{dd1}$ to $V_{dd4}$ may either add up, form an average power level, or be combined according to some other function of the two or more power levels involved. Thus, depending on the implementation, there may be only one temporarily selected fixed power level supply or there may be several temporarily selected fixed power level supplies.

Figure 5:
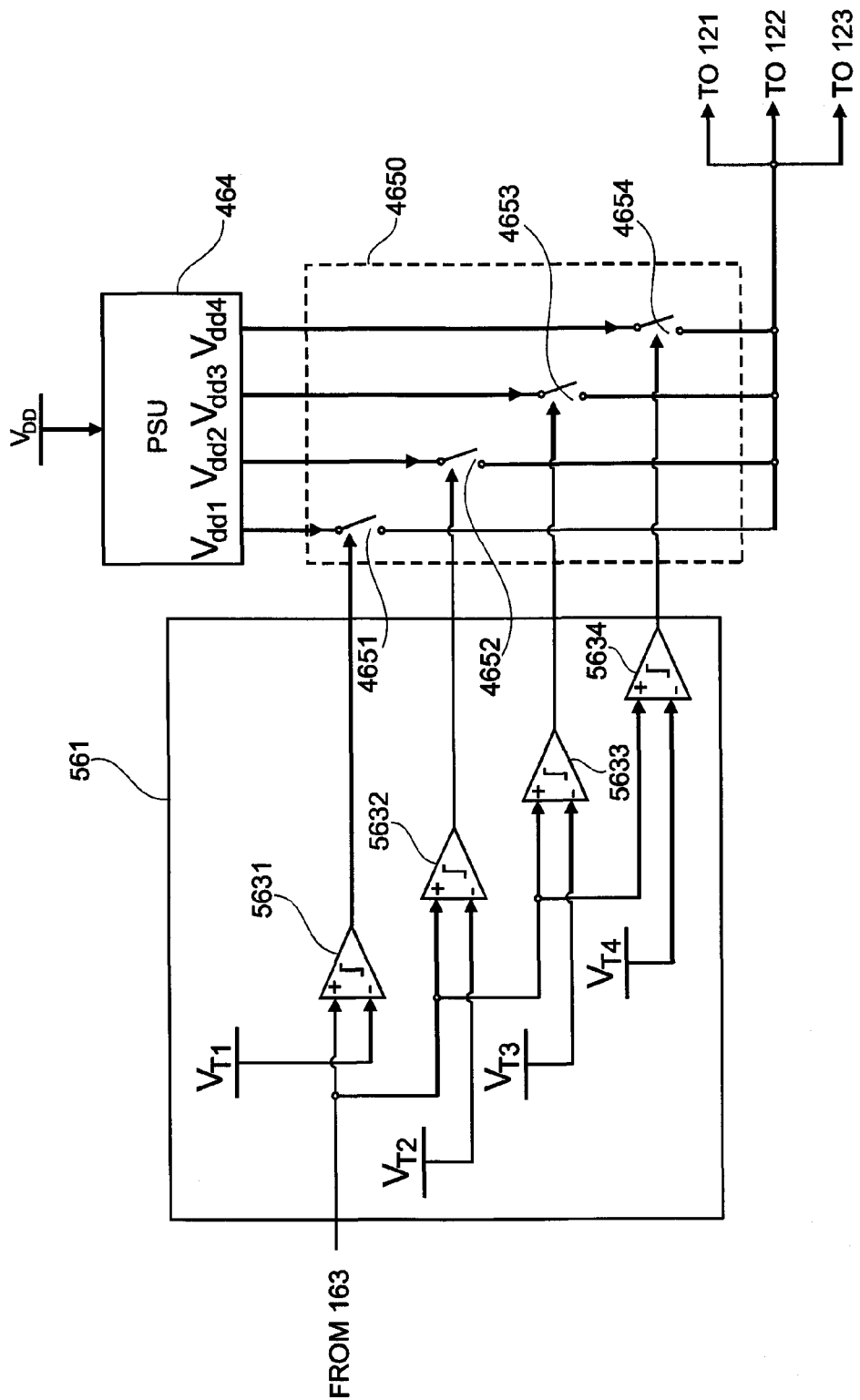
FIG. 5 shows yet another example of the internal architecture of the variable common power supply unit and of its associated control logic which could be included in a digital signal processor (DSP).

FIG. 5 shows a variant of the common envelope power supply shown in FIG. 4. The comparison of the common envelope signal 172 is performed within the DSP 104, more precisely in a part of 561 of the DSP 104. The comparisons of the common envelope signal 172 with the threshold voltages $V_{T1}$ to $V_{T4}$ is thus performed by comparators 5631, 5632, 5633, and 5634 which are implemented digitally within the DSP 104, possibly using a software module. This solution would remove the need for the digital-to-analogue-converter 163. The DSP 104 would directly provide control signals for the switch matrix 4650 and its switches 4651 to 4654.

Figure 6:
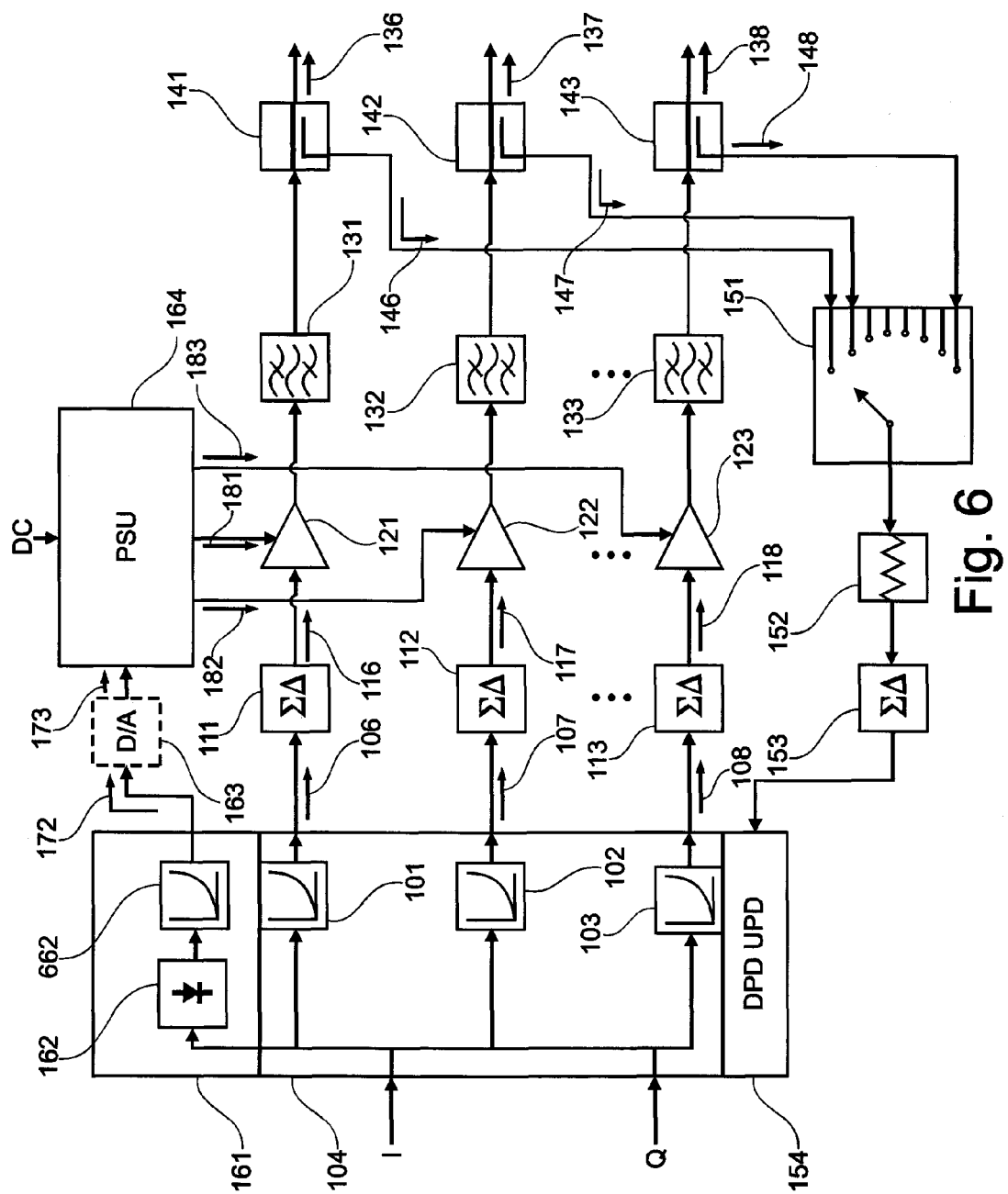
FIG. 6 shows an active antenna array with common envelope tracking according to a third possible configuration.

FIG. 6 illustrates that it is also possible to incorporate an envelope pre-distortion function 662 within the DSP 104. This enables a more sophisticated pre-distortion characteristic to be employed and also saves some hardware costs. Note that it should not be necessary to update this envelope pre-distortion characteristic in the same way as it is required for an I and Q pre-distortion of the transmission path signals. The signal envelope only needs to be followed approximately and not with the very high degree of precision which a main signal pre-distortion system aims to achieve.

In the common envelope power supply unit shown in FIG. 3 the pre-distorter 363 would not be needed anymore, if the DSP 104 provides for a pre-distortion function, already.

Figure 7:
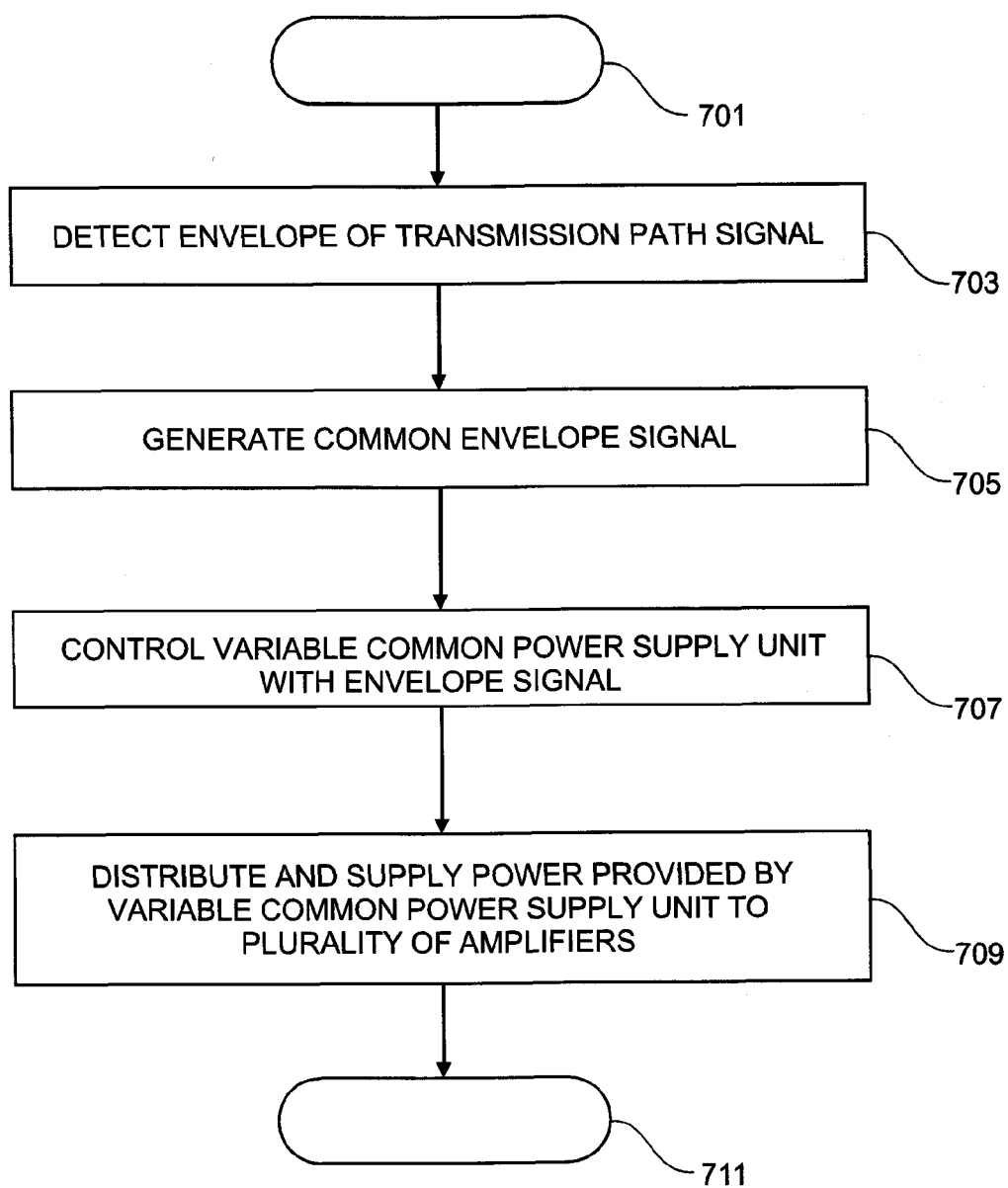
FIG. 7 shows a flow chart of a method according to the teachings disclosed herein.

FIG. 7 shows a schematic flow chart of a method according to the teachings disclosed herein. Starting at block 701 the method first detects an envelope of a transmission path signal at block 703. The detection of the envelope of the transmission path signal(s) may be implemented digitally. It may be sufficient to analyse only one of the plurality of similar transmission path signal. In the alternative, a (weighted) average of the transmission path signals could be analysed, or a particularly strong transmission path signal within the plurality of similar transmission path signals could be analysed, for example. Another option is to employ a common input signal for the active antenna array by deriving the envelope using, for example, sqrt($I^2+Q^2$) or a similar envelope detection function or look-up table based non-linearity.

At the next block 705 a common envelope signal is generated. The common envelope signal may be generated in such a manner that it suits all of the similar transmission path signals in terms of their needs with respect to an envelope signal.

The variable common power supply unit 164 (see FIG. 1) is controlled by means of the common envelope signal at block 707. The variable common power supply unit is mostly an analogue component but may be constructed to accept digital control signals or analogue control signals, depending on the design. When digital control signals are used to control the variable common power supply unit 164, these digital control signals could be sent via existing data communication structures of a base station, for example, if available.

Power provided by the variable common power supply unit 164 is then distributed and supplied to the plurality of amplifiers 121, 122, 123 in the plurality of transmission paths, at block 709. The distribution of the power within the active antenna array may, for example, be achieved by means of a power distribution array as described in the Applicant's U.S. patent application Ser. No. 12/562,313, entitled "Power distribution for an array of active electronic circuits in an antenna", filed 18 Sep. 2009. The entire disclosure of the foregoing application is incorporated herein by reference. For example, a bus bar arrangement could be employed.

The method ends at block 711. It should be noted that the actions of the method may in fact be performed concurrently by the different components that are involved in the common envelope tracking as described herein.

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a central processing unit ("CPU"), micro processor, micro controller, digital signal processor, processor core, system on chip ("SOC") or any other device), implementations may also be embodied in software (e.g. computer readable code, program code, and/or instructions disposed in any form, such as source, object or machine language) disposed for example in a computer useable (e.g. readable) medium configured to store the software. Such software can enable, for example, the function, fabrication, modelling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known computer useable medium such as semiconductor, magnetic disc, or optical disc (e.g., CD-ROM, DVD-ROM, etc.). The software can also be disposed as a computer data signal embodied in a computer useable (e.g. readable) transmission medium (e.g., carrier wave or any other medium including digital, optical, analogue-based medium). Embodiments of the present invention may include methods of providing the apparatus described herein by providing software describing the apparatus and subsequently transmitting the software as a computer data signal over a communication network including the internet and intranets.

It is understood that the apparatus and method describe herein may be included in a semiconductor intellectual property core, such as a micro processor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. An active antenna array comprising:
a plurality of transmission paths in the active antenna array, the plurality of transmission paths being adapted to carry a plurality of similar transmission path signals, wherein at least one of the plurality of transmission paths comprises an amplifier having a power input and a signal input for one of the plurality of similar transmission path signals;
a variable common power supply unit connected to the power input of the amplifier for supplying power to the amplifier;
an envelope detection system connected to an envelope input of the variable common power supply unit and adapted to provide a common envelope signal for the plurality of similar transmission path signals to the variable common power supply unit,
wherein one of the variable common power supply unit and the envelope detection system comprises a predistorter adapted to predistort the common envelope signal.

2. The active antenna array according to claim 1, further comprising a digital-to-analogue converter connected, at an input of the digital-to-analogue converter, to the envelope detection system and, at an output of the digital-to-analogue converter, to the variable common power supply unit.

3. The active antenna array according to claim 1, wherein the envelope detection system is adapted to receive at least one of the plurality of similar transmission path signals and to determine the common envelope signal on the basis of the at least one of the plurality of similar transmission path signals.

4. The active antenna array according to claim 3, wherein the predistorter is adapted to predistort the common envelope signal to provide a margin between an envelope of the at least one of the plurality of similar transmission path signals and the common envelope signal.

5. The active antenna array according to claim 1, wherein the variable common power supply unit comprises
an envelope power supply, an output of which is connected to the power inputs of the amplifiers,
a comparator adapted to compare the common envelope signal with a threshold to provide a comparator output signal, and
a selector switch controlled by the comparator output signal and adapted to selectively connect an input of the envelope power supply with the common envelope signal if the envelope signal is greater than the threshold and with a constant signal if the common envelope signal is smaller than the threshold.

6. The active antenna array according to claim 1, wherein the variable common power supply unit comprises
a plurality of fixed power level supplies, wherein at least one of the plurality of fixed power level supplies provides a different power level than another one of the plurality of fixed power level supplies;
a plurality of switches connected to the plurality of fixed power level supplies and adapted to connect a temporarily selected one of the plurality of fixed power level supplies with the power inputs of the plurality of amplifiers.

7. The active antenna array according to claim 6, wherein the variable common power supply unit further comprises a plurality of comparators adapted to compare the common envelope signal with a plurality of power thresholds and to control the plurality of switches in order to connect the temporarily selected one of the plurality of fixed power level supplies with the power inputs of the plurality of amplifiers, as a function of which power thresholds are greater than the common envelope signal.

8. The active antenna array according to claim 6, wherein each of the plurality of fixed power level supplies provides a different fixed voltage.

9. The active antenna array according to claim 1, wherein the envelope detection system is implemented as a digital circuit.

10. The active antenna array according to claim 9, wherein the envelope detection system further comprises at least one of a digital predistorter acting on the common envelope signal and a comparator adapted to compare the common envelope signal with a threshold.

11. The active antenna array according to claim 1, wherein the envelope detection system is implemented in software for execution by a digital signal processor.

12. The active antenna array according to claim 11, wherein the software further implements at least one of a digital predistortion of the common envelope signal and a comparator of the common envelope signal with a threshold.

13. The active antenna array according to claim 1, further comprising at least one additional variable common power supply unit, wherein the variable common power supply unit supplies a first group of amplifiers and the at least one additional variable common power supply unit supplies at least one additional group of amplifiers, the amplifiers of the first group of amplifiers having a first power rating and the amplifiers of the at least one additional group having at least one additional power rating different to the first power rating.

14. The active antenna array according to claim 13, wherein each of the plurality of transmission paths comprises an antenna element and wherein the first group of amplifiers and the at least one additional group of amplifiers provide a profiled power distribution of the active antenna array over the antenna elements of the plurality of transmission paths.

15. The active antenna array according to claim 1, wherein the amplifiers of the plurality of transmission paths are Doherty amplifiers.

16. The active antenna array according to claim 1, wherein each of the plurality of transmission paths comprises an upconverter for upconverting a corresponding one of the plurality of similar transmission path signals to a radio frequency range, and wherein the amplifiers of the plurality of transmission paths are adapted to amplify a radio frequency signal.

17. The active antenna array according to claim 1, further comprising a feedback path between an output of at least one of the plurality of transmission paths and the envelope detection system, wherein the envelope detection system is adapted to perform an analysis of a feedback signal transmitted via the feedback path and to adjust settings used for generating the common envelope signal as a function of the analysis of the feedback signal.

18. A computer program product embodied on a non-transitory computer-readable medium and the non-volatile computer-readable medium comprising executable instructions for the manufacture of an active antenna array comprising:
a plurality of transmission paths in the active antenna array, the plurality of transmission paths being adapted to process a plurality of transmission path signals similar to each other, wherein each of the plurality of transmission paths comprises an amplifier having a power input and a signal input for one of the plurality of transmission path signals;
a variable common power supply unit connected to the power inputs of the amplifiers for supplying power to the amplifiers;
an envelope detection system connected to an envelope input of the variable common power supply unit and adapted to provide a common envelope signal for the plurality of transmission path signals to the variable common power supply unit,
wherein one of the variable common power supply unit and the envelope detection system comprises a predistorter adapted to predistort the common envelope signal.

19. A method for performing envelope tracking on a plurality of amplifiers that amplify a plurality of similar transmission path signals in an active antenna array, the method comprising:
detecting an envelope of at least one of the plurality of similar transmission path signals;
generating a common envelope signal based on the detected envelope of the at least one of the plurality of t similar transmission path signals;
controlling a variable common power supply unit with the common ˆ envelope signal;
distributing and supplying power provided by the variable common power supply unit to the plurality of amplifiers, wherein one of the variable common power supply unit and the envelope detection system comprises a predistorter adapted to predistort the common envelope signal.

20. A computer program product stored on a non-transitory medium and comprising control logic stored therein for causing a computer to execute instructions that enable a processor to carry out a method comprising:
- detecting an envelope of at least one of the plurality of similar transmission path signals in an active antenna array;
- generating a common envelope signal based on the detected envelope of the at least one of the plurality of similar transmission path signal;
- controlling a variable common power supply unit with the common envelope signal;
- distributing and supplying power provided by the variable common power supply unit to the plurality of amplifiers,
- wherein one of the variable common power supply unit and the envelope detection system comprises a predistorter adapted to predistort the common envelope signal.

21. A chip set for an active antenna array comprising:
- a plurality of transmission paths in the active antenna array, the plurality of transmission paths being adapted to carry a plurality of similar transmission path signals, wherein at least one of the plurality of transmission paths comprises an amplifier having a power input and a signal input for one of the plurality of similar transmission path signals;
- a variable common power supply unit connected to the power input of the amplifier for supplying power to the amplifier;
- an envelope detection system connected to an envelope input of the variable common power supply unit and adapted to provide a common envelope signal for the plurality of similar transmission path signals to the variable common power supply unit,
- wherein one of the variable common power supply unit and the envelope detection system comprises a predistorter adapted to predistort the common envelope signal.

* * * * *